(12) United States Patent
Kikuchi

(10) Patent No.: US 7,902,641 B2  
(45) Date of Patent: Mar. 8, 2011

(54) SEMICONDUCTOR DEVICE AND MANUFACTURING METHOD THEREFOR

(75) Inventor: Yoshiyuki Kikuchi, Hillsboro, OR (US)

(73) Assignee: Tokyo Electron Limited, Tokyo (JP)

( * ) Notice: Subject to any disclaimer, the term of this patent is extended or adjusted under 35 U.S.C. 154(b) by 342 days.

(21) Appl. No.: 12/220,625

(22) Filed: Jul. 24, 2008

(65) Prior Publication Data

US 2010/0019356 A1  Jan. 28, 2010

(51) Int. Cl.  
*H01L 23/58* (2006.01)

(52) U.S. Cl. ......... 257/642; 257/635; 257/759; 257/760; 257/E21.264; 438/584; 438/623; 438/780

(58) Field of Classification Search ............ 257/40, 257/632, 642, 760, 635, 637, 736, 759, 783, 257/E21.264, E21.276; 438/637, 643, 672–675, 438/700, 733, 734, 758–763, 778–780, 463, 438/638, 400–404, 584–597, 622–624  
See application file for complete search history.

(56) References Cited

U.S. PATENT DOCUMENTS

| 6,720,659 B1 | 4/2004 | Akahori |
| 6,846,737 B1 | 1/2005 | Towle et al. |
| 7,235,490 B2 * | 6/2007 | Sato et al. ............ 438/700 |
| 2006/0131754 A1 * | 6/2006 | Ohtake et al. ............ 257/760 |

FOREIGN PATENT DOCUMENTS

| JP | 10-199976 | 7/1998 |
| JP | 10199976 A * | 7/1998 |

OTHER PUBLICATIONS

Japan Patent Office, International Search Report and Written Opinion in related PCT Application No. PCT/JP2009/003314, dated Oct. 13, 2009, 11 pages.

* cited by examiner

*Primary Examiner* — Evan Pert  
*Assistant Examiner* — Scott Wilson

(57) ABSTRACT

The present invention relates to a semiconductor device. The semiconductor device includes a fluorocarbon film formed on a substrate and a film containing metal formed on the fluorocarbon film, wherein the content amount of fluorine atom on the fluorocarbon film, which contacts the film containing metal, is in a predetermined range.

20 Claims, 4 Drawing Sheets

SEMICONDUCTOR DEVICE AND MANUFACTURING METHOD THEREFOR

TECHNICAL FIELD

The present invention relates to a semiconductor device and a manufacturing method therefor. Specifically relates to a semiconductor device adopting a fluorocarbon film as a portion of an interlayer, and a manufacturing method therefor.

BACKGROUND OF THE INVENTION

In recent years, with the progress of miniaturization and high integration of semiconductor integrated circuits, delay of an electric signal passes through a wiring (wiring delay) has becoming an issue to the increase in speed of the device operation. Because this wiring delay is proportional to the product of resistance of the wiring and the capacity between wirings, it has been demanded to lower the resistance of the electrode wiring material and lower the permittivity of the interlayer that insulates between each layer, in order to shorten the wiring delay.

As an interlayer, for example, a film (SiCOH film) having a relative permittivity of about 2.7 and containing porous silicon, which has sufficient mechanical strength, carbon, oxygen and hydrogen and a fluorine added carbon film (hereinafter referred as "fluorocarbon film), which is a compound of carbon (C) and fluorine (F) that are lower in relative permittivity compare to the SiCOH film, have been considered to be adopted.

This fluorocarbon film is low in oxidation resistance, heat resistance, pressure resistance, stress resistance and so on, thus it is difficult to apply as a single layer to a semiconductor device. For this reason, normally an insulator, such as silicon oxide that has been used as an interlayer material, is formed on a fluorocarbon film and used as a laminated interlayer.

Onto such an interlayer, a wiring (contact) to electrically connect wirings on upper and lower layers is formed. That is, the wiring (contact) is formed so as to pass through the interlayer. The wiring is configured by forming the contact hole passes thorough the interlayer and filling a conductive material into the contact hole. As a technique to form a wiring passes through an interlayer using a fluorocarbon film as a portion of interlayer, the technique disclosed in Unexamined Japanese Patent Application Publication No. H10-199976 can be considered.

Unexamined Japanese Patent Application Publication No. H10-199976 discloses a manufacturing method of a multi-layer wiring including the steps of forming an insulator 17 including at least a low-permittivity organic film (fluorocarbon film) 15 on a substrate 10, forming a via hole 18 on the insulator 17, and forming a via plug 23 on the via hole 18, wherein the via plug 23 is formed in a temperature not more than 350 degree/C. Further, the publication discloses that it is preferable to perform annealing of the low-permittivity organic film 15 before the forming process of the via plug 23 in a temperature range not less than a temperature for forming the via plug and not more than a temperature of thermal decomposition of the low-permittivity organic film 15. In this way, the low-permittivity organic film 15 is densified and the generation of gas in a small amount can be prevented, thereby resolving the issues of film peeling and insufficient filling of the via plug.

However, even the conventional technique described above does not consider the film peeling of a metal film contacting a fluorocarbon film. For this reason, as for the laminate body formed from a fluorocarbon film and a film containing metal, which contacts the fluorocarbon film, the development for the laminate body having a favorable adhesiveness between layers has been desired. Further, the development of a technique for a semiconductor device and a manufacturing method that are capable of forming a conductive layer with a favorable adhesiveness on an interlayer when a fluorocarbon film is used as a part of the interlayer, has been desired.

SUMMARY OF THE INVENTION

One aspect of the present invention is a first semiconductor device including a fluorocarbon film and a film containing metal formed on the fluorocarbon film, wherein a content amount of the fluorine atom on a surface of the fluorocarbon film, which contacts the film containing metal, is within predetermined range.

According to the semiconductor device of the embodiment, the content amount of the fluorine atom on a contact surface of the fluorine film when the fluorine film contacts the film containing metal is within a predetermined range. Here, the predetermined range means a range that allows the fluorine film to maintain the adhesiveness with the film containing metal on the surface of the fluorocarbon film. In this way, a semiconductor device provided with a film containing metal favorably adhered to a fluorocarbon film on the fluorocarbon film can be provided.

In the first semiconductor device pertaining to the present invention, the content amount of fluorine atom on the surface of the fluorocarbon film may be lower comparing to the content amount of the fluorine atom in the fluorocarbon film. In this configuration, since the film containing metal is provided on the surface of the fluorocarbon film, in which the fluorine concentration is decreased, a semiconductor device, in which a high adhesiveness is maintained between the fluorocarbon film and the film containing metal, can be provided.

In the first semiconductor device pertaining to the present invention, the film containing metal may contain at least tantalum.

A second semiconductor device pertaining to the present invention including a fluorocarbon film provided over a substrate and a film containing metal provided on the fluorocarbon film, wherein a content amount of the fluorine atom by an XPS analysis on a surface of the fluorocarbon film contacting the film containing metal is not more than 50%.

According to the second semiconductor device pertaining to the present invention, the content amount of the fluorine atom on the fluorocarbon surface which contacts the film containing metal, is not more than 50%. In this way, as described above, a semiconductor device, in which the fluorocarbon film and the film containing metal is favorably adhered, can be provided.

A third semiconductor device pertaining to the present invention including a semiconductor substrate, an inter layer formed over the substrate, which includes a multilayer containing two or more insulators different from each other, and at least one of which is a fluorocarbon film, and a contact which passes through the interlayer, wherein a content amount of the fluorine atom on the surface of the fluorocarbon film, which contacts the contact, is within a predetermined range.

In the third semiconductor pertaining to the present invention, the contact, which passes through the interlayer, contacts the fluorocarbon film at a portion of its side surface. On the surface of the fluorocarbon film, which contacts this contact, the content amount of the fluorine atom is within a predetermined range. For this reason, the metal element forming the contact is prevented from reacting with the fluorine atom. As a result, a semiconductor having a contact which favorably adhering to the interlayer, can be provided.

In the third semiconductor device pertaining to the present invention, the interlayer may include a stack of the fluorocarbon film and an insulator.

In the third semiconductor device pertaining to the present invention, the contact includes a conductive layer and a barrier film provided between the conductive layer and the interlayer, wherein the barrier film may at least include tantalum.

A manufacturing method of the first semiconductor device pertaining to the present invention includes the steps of forming a fluorocarbon film over a substrate, exposing the substrate in atmosphere containing gas of hydrogen-containing compound, and forming a film containing metal over the fluorocarbon film.

According to the manufacturing method of the first semiconductor device pertaining to the present invention, the exposed surface of the fluorocarbon film can be exposed to the gas of hydrogen-containing compound. In this way, the fluorine atom on the exposed surface of the fluorocarbon film can be reacted with the hydrogen atom in the hydrogen-containing compound and removed from the surface of the fluorocarbon film. For this reason, the reaction of the fluorine atom and the metal element can be prevented when the film containing metal is formed on such a fluorocarbon film. As a result, a semiconductor device having a fluorocarbon film and a film containing metal, which favorably adhere to the fluorocarbon film, can be manufactured.

In the manufacturing method of the first semiconductor device pertaining to the present invention, the heat treatment may be performed at a temperature of 200 degree/C. to 400 degree/C.

In the manufacturing method of the first semiconductor device pertaining to the present invention, the hydrogen-containing compound may be a compound containing Si—H bond.

In the manufacturing method of the first semiconductor device pertaining to the present invention, the compound containing hydrogen-containing compound may be organosilane.

In the manufacturing method of the first semiconductor device pertaining to the present invention, the organsilane may include at least trimethylsilane.

A manufacturing method of the second semiconductor device pertaining to the present invention include the steps of forming an interlayer including a fluorocarbon film over a substrate, forming a contact hole pass though the interlayer, exposing the substrate in atmosphere containing a gas of a hydrogen-containing compound, forming a barrier metal film on an inner surface of the contact hole, and forming a conductive layer in the contact hole.

According to the manufacturing method of the second semiconductor device pertaining to the present invention, the method includes a step of exposing the substrate in atmosphere containing a gas of hydrogen-containing compound after forming a contact hole. In this way, the fluorine atom on the surface of the fluorocarbon film exposed in the inner surface of the contact hole can be reacted with the hydrogen atom in the hydrogen-containing compound. As a result, the fluorine atom on the fluorocarbon film can be removed, thereby the contact can be formed in the contact hole with a favorable adhesiveness.

In the manufacturing method of the second semiconductor device pertaining to the present invention, the substrate may be exposed in the atmosphere of a temperature not less than 200 degree C.

In the manufacturing method of the second semiconductor device pertaining to the present invention, the substrate may be exposed in the atmosphere of temperature not more than 400 degree C.

In the manufacturing method of the second semiconductor device pertaining to the present invention, the hydrogen-containing compound may be organosilane.

In the manufacturing method of the second semiconductor device pertaining to the present invention, the conductive layer may mainly contain copper.

In the manufacturing method of the second semiconductor device pertaining to the present invention, the fluorocarbon film may be formed by using a gas at least one selected from a group including $C_2F_4$, $C_2F_6$, $C_3F_8$, $C_4F_8$, $C_5F_8$, $C_6F_6$, $CH_2F_2$, $CHF_3$.

DETAILED DESCRIPTION OF INVENTION

An embodiment of the present invention will be hereinafter explained.
(Semiconductor Device)

Figure 1:
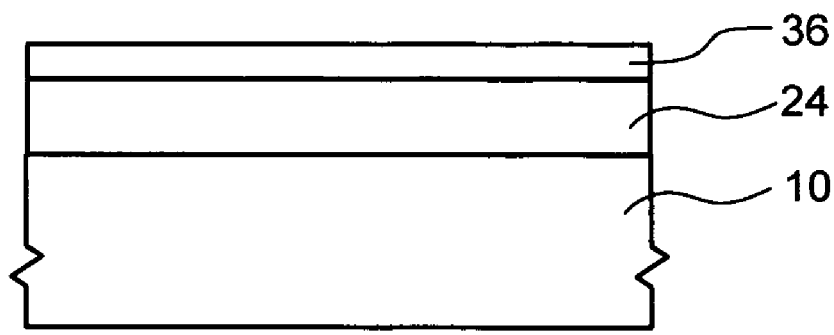
FIG. 1 is a cross section diagram illustrating a first semiconductor device pertaining to an embodiment.

A first semiconductor device pertaining to the embodiment will be hereinafter explained with reference to FIG. 1. FIG. 1 is a cross section diagram illustrating a semiconductor device pertaining to the embodiment. As shown in FIG. 1, the semiconductor device pertaining to the first embodiment has a substrate 10, a fluorocarbon film 24 formed over the substrate 10, and a film containing metal 36 on the fluorocarbon film 24. In addition, the fluorocarbon film 24 contacting the film containing metal 36 in the semiconductor device pertaining to the embodiment.

A single-crystal silicon substrate or a compound semiconductor substrate may be used for the substrate 10. The fluorocarbon film 24 is a fluorine added carbon film that is a compound of carbon (C) and fluorine (F), and generally a CF series material indicated by ($CF_x$). In addition, hydrogen atoms may partially be contained in the fluorocarbon film 24.

The film containing metal 36 is a film containing a metal element, and it may be formed only from the metal element, or it may contain an element other than the metal element. In addition, the metal element is not limited to one type, and it may contain two or more metal elements. As the film containing metal 36, Ta, TaN, Ti, TiN may be considered.

In the semiconductor device pertaining to the embodiment, a content amount of the fluorine atom on the surface of the fluorocarbon film 24, at the contact surface to the film containing metal 36, is within a predetermined range. Here, the predetermined range means a range within which at least a portion of the boundary between the fluorocarbon film 24 and the film containing metal 36 can maintain an adhered state. For example, on the surface of the fluorocarbon film 24 contacting the film containing metal 36, the atomic ratio (F/C) of carbon atom (C) and fluorine atom (F) may be preferably 1.0 to 0 and the atomic ratio (F/C) may be more preferably 0.2 to 0. Further, the content amount of the fluorine atom on the surface of the fluorocarbon film 24, which contacts the film containing metal 36 may be lower comparing to the content amount of the fluorine atom in the fluorocarbon film 24.

Figure 2:
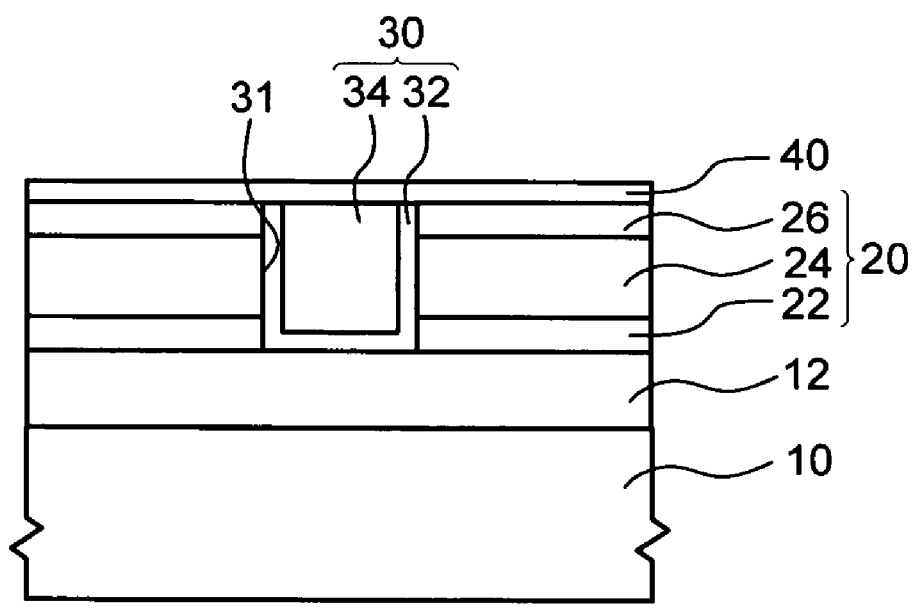
FIG. 2 is a cross section diagram illustrating a second semiconductor device pertaining to the embodiment.

Next, a second semiconductor device will be explained with reference to FIG. 2. FIG. 2 is a cross section diagram illustrating the second semiconductor device. In addition, in the semiconductor device shown in FIG. 2, the same reference numbers are used for the same members contained in the semiconductor device shown in FIG. 1 and the detailed explanation of those members will be omitted.

The second semiconductor device includes a substrate 10, a first interlayer 12, a second interlayer 20 and a contact 30 passes though the second interlayer 20. The first interlayer 12 is provided over the substrate 10. Although FIG. 2 does not illustrate in detail, various semiconductor elements or other wirings may be formed between the substrate 10 and the first interlayer 12. The second interlayer 20 is configured by stacking films formed from various insulating materials. The contact 30 including a barrier metal 32 and a conductive layer 34. A cap 40 film is formed to cover at least the conductive layer 34. In this embodiment, the cap film 40 is provided over the contact 30 and the second interlayer 20.

Silicon oxide ($SiO_2$), silicon nitride ($Si_xN_y$), carbonitride silicon (SiCN) and SiON film may be used for the first interlayer 12. A wiring (not shown) may be formed between the first interlayer 12 and the second interlayer 20.

The second interlayer 20 is configured by stacking a first insulator 22, a low-permittivity film 24 and a second insulator 26 in series. As the first insulator 22 and the second insulator 26, silicon oxide ($SiO_2$), silicon nitride ($Si_xN_y$), silicon carbide (SiC) and silicon nitride (SiCN), SiON film, SiCO film, SiCHO film and α-C film may be used. The first insulator 22 and the second insulator 26 may be formed from an identical material or materials different from each other. The second insulator 26 can act as a hard mask of the low-permittivity film 24 at patterning to form a contact hole 31 (described later), or an etching stopper at a CMP process after filling a conductive material layer in the contact hole (described later).

The film thickness of the first insulator 22 is preferably 5 nm~30 nm, and the film thickness of the second insulator 26 is preferably 5 nm~30 nm.

A low-permittivity film containing fluorine atom may be used as the low-permittivity film 24. For example, a fluorocarbon film may be considered as the low-permittivity film 24. In addition, the low-permittivity film 24 is referred as a fluorocarbon film 24 in the explanation below. The film thickness of the fluorocarbon film 24 is preferably 70 nm~150 nm.

The contact 30 passes through the second interlayer 20. And the contact 30 functions to connect a lower layer wiring (not shown) and an upper layer wiring (not shown). Specifically, the contact 30 includes a contact hole 31 passes though the second interlayer 20, a barrier film 32 covers an inner surface of the contact hole 31 and a conductive layer 34 filling the contact hole 31.

In the semiconductor device pertaining to the embodiment, a bottom surface of the contact hole 31 is formed from the first interlayer 12, and a side surface is formed from the first insulator 22, fluorocarbon film 24 and second insulator 26. Namely, the barrier film 32 is formed on the surface of the first interlayer 12, first insulator 22, fluorocarbon film 24 and second insulator 26. At this time, a content amount of the fluorine atom in the surface of the fluorocarbon film 24 contacting the barrier film 32 is within a predetermined range. Specifically, it is a range within which at least portion of the fluorocarbon film 24 and the barrier film 32 contacting the fluorocarbon film 24 are able to maintain an adhered condition. Further, a content amount of the fluorine atom on the fluorocarbon film 24, which contacts the barrier film 32, may be lower than the content amount of the fluorine atom in the fluorocarbon film 24.

Further, the semiconductor device pertaining to the present invention is characterized by having a C—Si bond on the contact surface to the film containing metal 36, that is the surface of the fluorocarbon film 24. Further, on the surface of the fluorocarbon film 24, the atomic ratio (F/C) of carbon atom (C) and fluorine atom (F) may be preferably 1.0~0 and the atomic ratio (F/C) may be more preferably 0.2~0.

The barrier film 32 functions to increase the adhesiveness of the metal material forming the conductive layer 34 and the second interlayer 20, and to suppress the metal material from diffusing into the second interlayer 20. As the barrier film 32, a high-melting point metal, or a high-melting point metal compound may be used. Concretely, Ta, TaN, Ti, TiN may be considered. The film thickness of the barrier film is preferably 5~15 nm. Further, the barrier film 32 may be configured by a single layer, or a multilayer.

The conductive layer 34 is preferably formed from a conductive material mainly containing one or more types of metal element. As such a metal element, copper or Al may be used. By using the copper as a conductive material, a low-resistance wiring can be realized. In addition, the main component referred here is that a component makes up not less than half of the material when entire the conductive material is 100%.

The cap film 40 is formed at least on the conductive layer 34. The cap film 40 is a layer to suppress the diffusion of the conductive material to the interlayer (not shown) formed over the contact 30, and diffusion of the main component forming the contact. Specifically, the film thickness of the cap film 40 is preferably 10~30 nm and more preferably 30~60 nm. SiCN film, SiC film, SiN film and α-C film may be used as the cap film 40. In addition, the cap film 40 in the embodiment may also be referred as a protective film 40.

The semiconductor device pertaining to the embodiment is a semiconductor device having an insulator (for example, the fluorocarbon film 24) containing fluorine atom contacting to a film containing metal such as the barrier film 32, and a content amount of the fluorine atom in the contact surface is within a predetermined range. Concretely, the content amount of the fluorine atom on the contact surface to the film containing metal is lower comparing to the content amount of the fluorine atom in the film. Further, in the semiconductor device pertaining to the embodiment, the content amount of silicon atom on the surface contacting the film containing metal 36 on the surface of the fluorocarbon film 24 is larger than the content amount of the silicon atom in the film. By adopting such a configuration, the fluorine atom on the surface of the fluorocarbon film 24 is suppressed from reacting with the film containing metal 36. For this reason, the fluorocarbon film 24 and the film containing metal 36 can favorably be adhered. As a result, a semiconductor device with a high-reliability, in which peeling of the contact 30 from the contact hole 31 is prevented, can be provided.

(Manufacturing Method of Semiconductor Device)

Next, a manufacturing method of the semiconductor device of the preset invention will be explained. The manufacturing method of the semiconductor device pertaining to the present invention is characterized by including the steps of; forming an interlayer including a fluorocarbon film over a substrate, forming a contact hole passes though the interlayer, exposing the substrate in atmosphere containing a gas of hydrogen-containing compound, forming a barrier metal on an inner surface of the contact hole and forming a conductive layer in the contact hole.

Further, another manufacturing method of the semiconductor device pertaining the present invention is characterized by including the steps of; forming a fluorocarbon film on a substrate, performing a heat treatment to an exposing surface of the fluorocarbon film in atmosphere containing a gas of hydrogen-containing compound and forming a film containing metal on the fluorocarbon film after the heat treatment process. That is, the manufacturing method of the semiconductor device pertaining to the present invention is a manufacturing method of a semiconductor device to form a film containing metal, which contacts a fluorocarbon film, and characterized by including a step of performing a treatment to an exposing surface of the fluorocarbon film before forming the film containing metal.

An embodiment of the manufacturing method of the semiconductor device of the present invention will be explained below with reference to FIGS. 3 to 8. In addition, explained below is the manufacturing method of the semiconductor device shown FIG. 2. However, needless to say, the manufacturing method explained below may be applied to the manufacturing method of the semiconductor device shown in FIG. 1.

Figure 3:
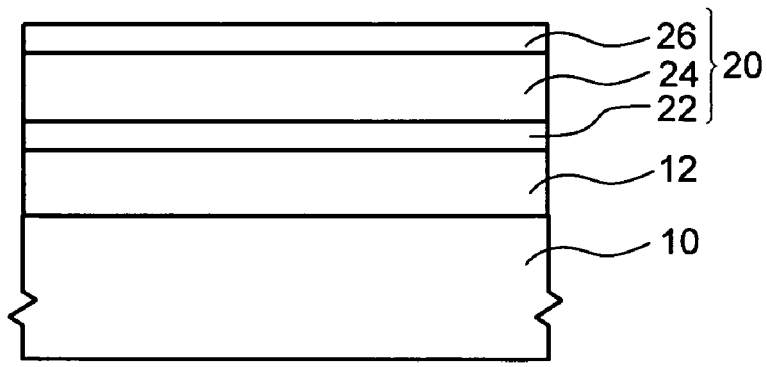
FIG. 3 is a cross section diagram illustrating a process of manufacturing process of a semiconductor device pertaining to the embodiment.

First, as shown in FIG. 3, a first interlayer 12 is formed over a substrate 10. The first interlayer 12 may be formed by, for example, a CVD method. At this time, the film thickness of the first interlayer 12 may be 100 nm~300 nm. Next, a second interlayer 20 is formed on the first interlayer 12. When forming the second interlayer 20, specifically, a first insulator 22 is formed at first. The insulating material that can be used as the first insulator 22 is what is as described above. However, it is preferably SiCN. As a forming method, the CVD method may be employed. When forming SiCN as the first insulator 22, methane, silane, monomethylsilane (1MS), dimethylsilane (2MS), trimethylsilane (3MS), tetramethylsilane (4MS) and silazane may be used as a supply gas. Theses gasses may be used by mixing them. Further, in addition to the gasses above, nitrogen ($N_2$), ammonia ($NH_3$) or the like may be added to form a film. The film thickness of the first insulator 22 may be 5 nm~60 nm.

Next, a fluorocarbon film 24 is formed on the first insulator 22. The fluorocarbon film 24 may be formed by, for example, the CVD method. When CVD method is used, $C_2F_4$, $C_2F_6$, $C_3F_8$, $C_4F_8$, $C_5F_8$, $C_6F_6$, $CH_2F_2$, $CHF_3$ or the like may be considered as a material gas (supply gas). For example, $C_5F_8$ may be octafluorocyclopentene, octafluoropentyne or octafluoropentadiene. Hydrogen atom may partially be contained in the formed fluorocarbon film 24. At this time, a parallel plate type CVD device or a CVD device employing microwave plasma using RLSA (Radial Line Slot Antenna) may be used as a CVD device. Further, the film thickness of the fluorocarbon film 24 is preferably 70 nm~150 nm.

Next, a second insulator 26 is formed on the fluorocarbon film 24. The second insulator 26 may be formed as the first insulator 22. This second insulator 26 acts as a hard mask when forming a contact hole described later, or an etching mask or a CMP stopper when forming a contact 30. The film thickness of the second insulator 26 is preferably 30 nm~60 nm.

Figure 4:
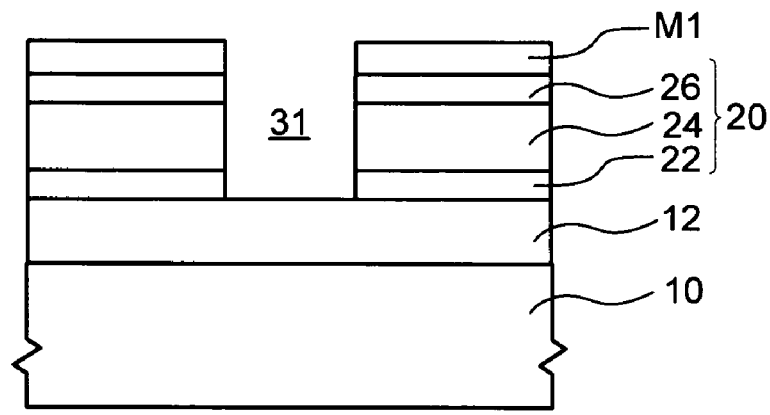
FIG. 4 is a cross section diagram illustrating a process of manufacturing process of a semiconductor device pertaining to the embodiment.

Next, as shown in FIG. 4, a contact hole 31 is formed on the second interlayer 20. In this process, specifically, a mask M1 having an opening in a predetermined area is formed on the second interlayer 20. For example, a resist may be used as the mask M1. Next, the contact hole 31 can be formed by etching the second interlayer 20 by using the mask M1 as a mask. The etching of the second interlayer 20 may be performed, for example, by a wet etching method or a dry etching method. The contact hole 31 formed in this way has a bottom surface formed by the first interlayer 12, and a side surface formed by the first insulator 22, fluorocarbon film 24 and second insulator 26. Namely, the fluorocarbon film 24 is exposed to the inner surface of the contact hole 31.

Figure 5:
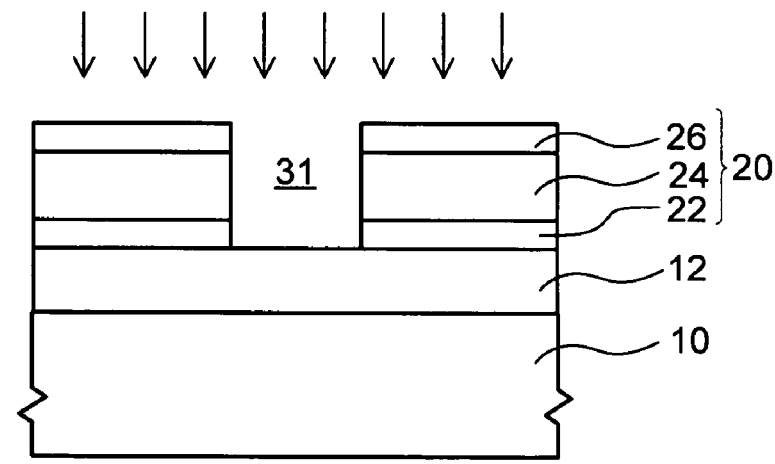
FIG. 5 is a cross section diagram illustrating a process of manufacturing process of a semiconductor device pertaining to the embodiment.

Next, the substrate 10 is exposed in atmosphere containing hydrogen contained compound as shown in FIG. 5. In this way, a treatment can be performed on the surface of the fluorocarbon film 24 exposed on the inner surface of the contact hole 31. The hydrogen-containing compound is to be an organosilane compound and a compound in which at least one or more hydrogen atom is bond to the silicon in the silane compound. For example, monomethyl silane (1MS), dimethyl silane (2MS), trimethyl silane (3MS), tetramethyl silane (4MS), $SiH_4$ and $Si_2H_6$ may be considered as the compound.

In this process, the temperature of treatment atmosphere is preferably 200 degree C.~400 degree C. When the temperature of the treatment atmosphere is lower than 200 degree C., the surface of the fluorocarbon film 24 cannot be treated favorably. In this process, concentration of the hydrogen-containing compound is preferably 20~100%, more preferably 100%. When lower than 20%, the fluorine atom concentration on the surface cannot be decreased. In the treatment atmosphere, an inert gas, such as Ar, may be contained other than the hydrogen compound within the range described above.

In the process of exposing the substrate 10 in the atmosphere containing the hydrogen-containing compound, the substrate 10 may be exposed to the atmosphere, in which plasma of the hydrogen-containing compound is generated. In such a case, a parallel flat plate type plasma generator or a microwave plasma generator using RLSA (Radial Line Slot Antenna) may be utilized as a method for generating plasma of the hydrogen-containing compound. When the microwave plasma generator is utilized, low energy plasma can be obtained, and there is an advantage of suppressing damage to the substrate 10.

Figure 6A:
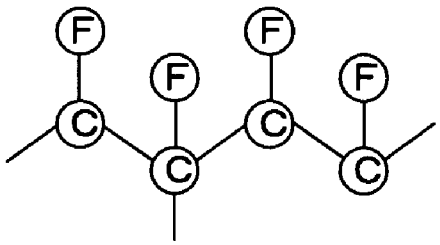
FIG. 6a illustrates a condition of a surface of a fluorocarbon film in a cap film forming process in a manufacturing method of a semiconductor device pertaining to the embodiment.
Figure 6B:
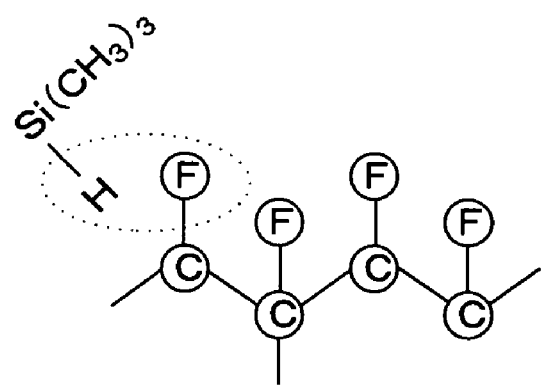
FIG. 6b illustrates a condition of a surface of a fluorocarbon film in a cap film forming process in a manufacturing method of a semiconductor device pertaining to the embodiment.
Figure 6C:
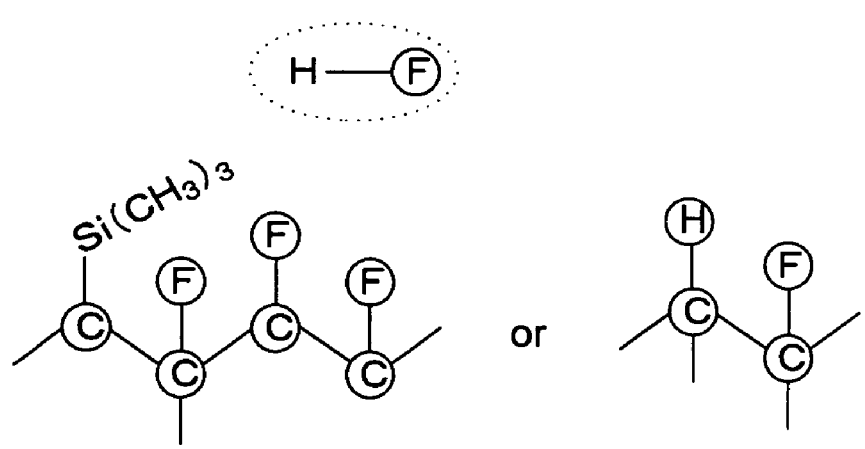
FIG. 6c illustrates a condition of a surface of a fluorocarbon film in a cap film forming process in a manufacturing method of a semiconductor device pertaining to the embodiment.

A reaction that occurs on the surface of the exposed fluorocarbon film 24 when exposing the substrate 10 in the atmosphere of hydrogen-containing compound in this way, will be hereinafter explained with reference to FIG. 6. FIGS. 6*a* to 6*c* illustrate a condition of the surface of the fluorocarbon film. FIG. 6*a* shows a composition of the surface of the fluorocarbon film prior to exposing the substrate 10 in the hydrogen compound atmosphere. FIG. 6*b* and 6*c* illustrate a condition of the reaction occurred on the surface during the process of exposing the substrate 10 in the hydrogen-containing compound atmosphere. Explained below is a case where the trimethylsilane is used as a hydrogen contained compound.

An example of condition for the process of exposing the substrate 10 in the atmosphere of hydrogen-containing compound, that is, a treatment process of the surface of the fluorocarbon film 24 will be explained hereinafter. Explained below is a case where the trimethylsilane is used as a hydrogen contained compound. Concretely, the condition of forming a film is preferably as follows, treatment temperature; 380 degree/C., forming pressure; 180 mTorr, trimethylsilane flow rate; 100 sccm, Ar flow rate; 2000, sccm microwave power; 4500 W and RF bias power; 0-10 W. Further, the treatment time is preferably 6 seconds to 13 seconds. Also, Explained below is a case where the trimethylsilane is used as a hydrogen contained compound without plasma (since only gas is used, the microwave power and RF bias power is not used). Concretely, the condition of forming a film is preferably as follows, 3MS/Ar gas concentration; 20%-100% (the total amount of gas may be 420 sccm), forming pressure; 2 Torr-10 Torr, treatment time; 30 seconds-7200 seconds, treatment temperature; 200-400 degree/C. In addition, the best treatment condition is below, forming pressure; 10 Torr, 3MS/Ar gas concentration; 100%, treatment time; 60 seconds, treatment temperature; 380 degree/C.

There are two important reactions in the present invention, one of the important reactions is that hydrogen atom provided from trimethylsilane (3MS) removes fluorine atom on surface of $CF_x$ film. The hydrogen atom combines with fluorine atom to form hydrogen fluoride (HF). The other important reaction is to cap carbon atom resulting from removal fluorine atom on surface of $CF_x$ film. For example, $Si(CH_3)_3$ may be used to cap the carbon atom. As can be noted from the foregoing, the atomic ratio of fluorine atom/carbon atom (F/C) is very important value for the present invention.

Figure 7:
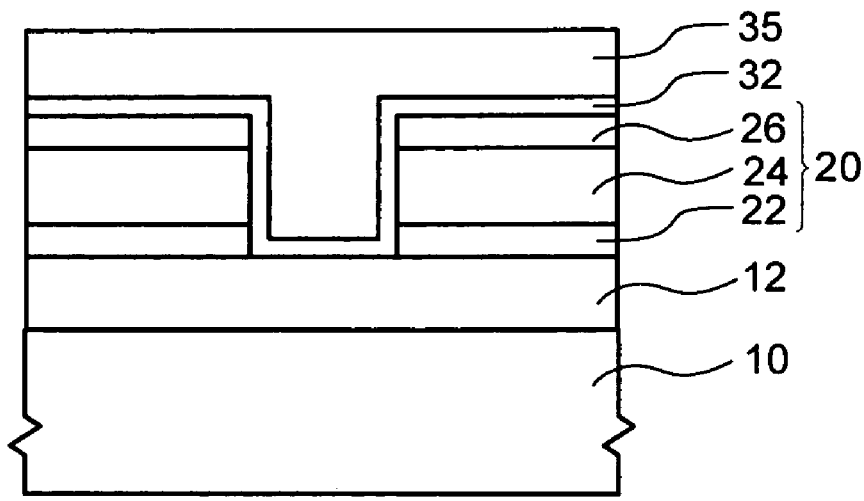
FIG. 7 is a cross section diagram illustrating a process of a manufacturing method of a semiconductor pertaining to the embodiment.

Next, the contact 30 is formed on the contact hole 31. At the forming of the contact 30, first, a barrier film 32 is formed at least on an inner surface of the contact hole 31 as shown in FIG. 7. The barrier film 32 may be formed, for example, by a sputtering method. Next, a conductive material layer 35, which is the conductive layer 34, is formed so as to cover inside the contact hole 31 and over the second interlayer 20. The conductive layer 35 is preferably mainly containing copper. The sputtering method, electrolytic plating method, or electroless plating method may be used to form the conductive layer 35.

Figure 8:
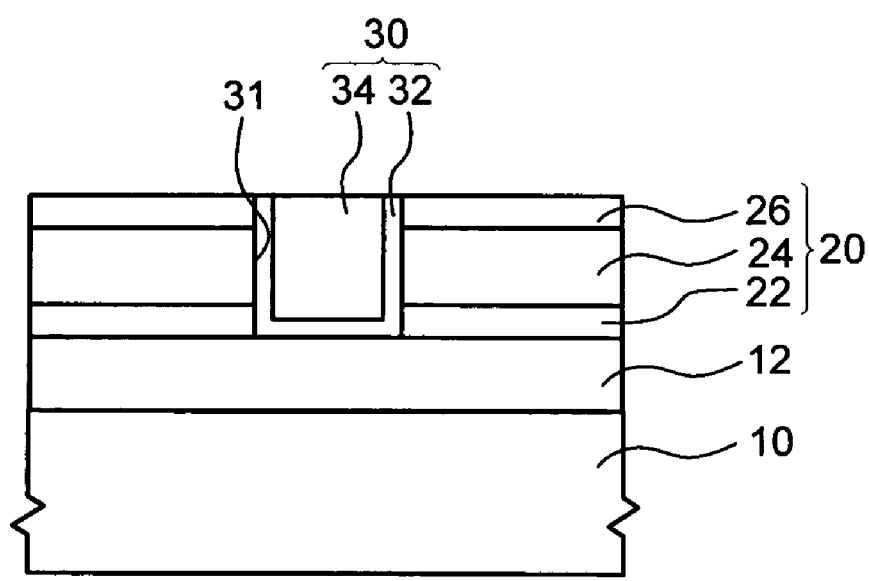
FIG. 8 is a cross section diagram illustrating a process of a manufacturing method of a semiconductor pertaining to the embodiment.

Next, as shown in FIG. 8, a portion of the conductive material layer 35 and the barrier film 34 is removed until an upper surface of the interlayer 20 is exposed. The removal of the conductive material layer 35 and the barrier film 34 may be performed, for example, by a CMP (Chemical Mechanical Polishing) method. In this way, the contact 30 can be formed in the contact hole 31.

Next, as shown in FIG. 2, the cap film 40 is formed at least on the contact 30. As the cap film 40, for example, SiCN film, SiC film, SiN film, α-C film may be formed. This cap film 40 functions to prevent the conductive material forming the contact 30 from diffusing into the interlayer (not shown) formed over the contact 30. The semiconductor device pertaining to the embodiment can be manufactured by the processes above.

According to the manufacturing method of a semiconductor device pertaining to the embodiment, the surface of the fluorocarbon film 24 exposing to the inner surface of the contact hole 31 can be treated by exposing the substrate 10 to the atmosphere containing hydrogen-containing compound after forming the contact hole 31. Concretely, the fluorine atom on the surface of the fluorocarbon film 24 can be removed. This can keep the content amount of the fluorine atom on the fluorocarbon film 24 within a predetermined range. As a result, the adhesiveness of the contact 30 filled in the contact hole 31 can be increased, thereby a semiconductor device with a high reliability can be manufactured. In addition, the adhesiveness of the contact 30 may be verified by SEM or visual observation.

What is claimed is:

1. A semiconductor device comprising:
a fluorocarbon film formed over a substrate; and
a film containing metal formed on the fluorocarbon film,
wherein a content amount of the fluorine atom on a surface of the fluorocarbon film, which contacts the film containing metal, is lower than the content amount of the fluorine atom in the fluorocarbon film, and wherein the surface of the fluorocarbon film contains C—Si bonds.

2. The semiconductor device of claim 1, wherein the film containing metal contains at least Ta.

3. A semiconductor device comprising:
a fluorocarbon film formed over a substrate; and
a film containing metal, formed on the fluorocarbon film,
wherein a content amount of the fluorine atom by an XPS analysis at a surface of the fluorocarbon film contacting the film containing metal is not more than 50%.

4. A semiconductor device comprising:
a substrate;
an interlayer formed over the substrate, which includes a multi layer containing at least a fluorocarbon film; and
a contact which passes through the interlayer,
wherein a content amount of the fluorine atom on the surface of the fluorocarbon film, which contacts the contact, is lower than a content amount of the fluorine atom in the film, and wherein the surface of the fluorocarbon film contains C—Si bonds.

5. The semiconductor device of claim 4, wherein the interlayer includes a stack of the fluorocarbon film and an inorganic insulator.

6. The semiconductor device of claim 5, wherein the contact includes a conductive layer and a barrier film, which is formed between the conductive layer and the interlayer, and the barrier film contains at least Ta.

7. A manufacturing method for a semiconductor device, comprising the steps of:
forming a fluorocarbon film over a substrate;
exposing the surface of the fluorocarbon film in atmosphere, which contains the gas of hydrogen-containing compound containing a Si—H bond; and
forming a film containing metal on the fluorocarbon film.

8. The manufacturing method of claim 7, wherein the substrate is exposed at a temperature of 200 degrees C. to 400 degrees C.

9. The manufacturing method of claim 7, wherein the hydrogen-containing compound is an organosilane.

10. The manufacturing method of claim 9, wherein the organosilane includes at least monomethylsilane, dimethylsilane, or trimethylsilane.

11. The manufacturing method of claim 7, wherein a content amount of the fluorine atom on a surface of the fluorocarbon film, which contacts the film containing metal, is lower than the content amount of the fluorine atom in the fluorocarbon film.

12. The manufacturing method of claim 7, wherein the exposing forms C—Si bonds on the surface of the fluorocarbon film.

13. The manufacturing method of claim 7, wherein the hydrogen-containing compound includes silane or disilane.

14. A manufacturing method for a semiconductor device, comprising the steps of:
   constituting an interlayer, which contains a fluorocarbon film over a substrate;
   structuring a contact hole, which passes through the interlayer;
   exposing an inner surface of the contact hole to a hydrogen-containing compound atmosphere containing a Si—H bond;
   forming a barrier metal film on the inner surface of the contact hole; and
   forming a conductive layer in the contact hole.

15. The manufacturing method of claim 14, wherein the substrate is exposed to the atmosphere at the temperature not less than 200 degree C.

16. The manufacturing method of claim 15, wherein the substrate is exposed to an atmosphere at a temperature of not more than 400 degree C.

17. The manufacturing method of claim 16, wherein the hydrogen-containing compound is an organosilane.

18. The manufacturing method of claim 17, wherein the conductive layer contains copper as a major proportion.

19. The manufacturing method of claim 18, wherein the fluorocarbon film is formed by using gas at least one selected from the group consisting of $C_2F_4$, $C_2F_6$, $C_3F_8$, $C_4F_8$, $C_5F_8$, $C_6F_6$, $CH_2F_2$ and $CHF_3$.

20. The manufacturing method of claim 14, wherein a content amount of the fluorine atom on a surface of the fluorocarbon film, which contacts the barrier metal film in the contact hole, is lower than the content amount of the fluorine atom in the fluorocarbon film.

* * * * *